(12) United States Patent
Cawthorne

(10) Patent No.: US 8,120,320 B2
(45) Date of Patent: Feb. 21, 2012

(54) METHOD FOR UPDATING MINIMUM AND MAXIMUM ENERGY STORAGE VALUES

(75) Inventor: William R. Cawthorne, Milford, MI (US)

(73) Assignee: GM Global Technology Operations LLC

( * ) Notice: Subject to any disclaimer, the term of this patent is extended or adjusted under 35 U.S.C. 154(b) by 781 days.

(21) Appl. No.: 12/186,594

(22) Filed: Aug. 6, 2008

(65) Prior Publication Data

US 2009/0045778 A1   Feb. 19, 2009

Related U.S. Application Data

(60) Provisional application No. 60/964,880, filed on Aug. 15, 2007.

(51) Int. Cl.
*H02J 7/00* (2006.01)
(52) U.S. Cl. .................. 320/116; 320/134; 320/136
(58) Field of Classification Search ............ 320/104, 320/109, 116–120, 123, 132–140
See application file for complete search history.

(56) References Cited

U.S. PATENT DOCUMENTS

| | | | | | |
|---|---|---|---|---|---|
| 5,027,294 | A | * | 6/1991 | Fakruddin et al. | 713/300 |
| 6,061,639 | A | * | 5/2000 | Wistrand | 702/63 |
| 6,163,086 | A | * | 12/2000 | Choo | 307/43 |
| 7,443,140 | B2 | * | 10/2008 | Barsukov et al. | 320/136 |
| 2006/0149417 | A1 | * | 7/2006 | Han et al. | 700/245 |

\* cited by examiner

*Primary Examiner* — Huy Q Phan
*Assistant Examiner* — Son Le

(57) ABSTRACT

A battery control system comprises a battery control module, an averaging module, and a supervisor module. The battery control module measures voltages of N energy storage blocks, wherein N is an integer greater than one, and determines a first voltage of the voltages at a first rate. The first voltage is one of a maximum voltage and a minimum voltage. The averaging module calculates an average voltage at a second rate that is greater than the first rate. The average voltage is based on a measured total voltage of an energy storage pack including the N energy storage blocks. The supervisor module generates an updated voltage based on the first voltage and the average voltage and controls a vehicle system based on the updated voltage.

20 Claims, 10 Drawing Sheets

US 8,120,320 B2

METHOD FOR UPDATING MINIMUM AND MAXIMUM ENERGY STORAGE VALUES

CROSS-REFERENCE TO RELATED APPLICATIONS

This application claims the benefit of U.S. Provisional Application No. 60/964,880, filed on Aug. 15, 2007. The disclosure of the above application is incorporated herein by reference.

FIELD

The present disclosure relates to energy storage values, and more particularly to updating minimum and maximum energy storage values.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Referring now to FIG. 1, a functional block diagram of an energy storage system 100 is presented. For example, the energy storage system 100 may provide power to loads within a vehicle and receive power from one or more generators. Loads and generators are represented generally by 102. For example, loads may include vehicle accessories and motors for propulsion of the vehicle. The energy storage system 100 includes an energy storage pack 104. The energy storage pack includes individual energy storage blocks 106-1, 106-2, ... and 106-$n$, collectively energy storage blocks 106. The energy storage blocks 106 are wired in series.

The voltage of each of the energy storage blocks 106 is monitored by a battery control module 112. The battery control module 112 determines the energy storage blocks 106 having the minimum voltage and the maximum voltage. The battery control module 112 may include a single input for measuring voltage, which is connected sequentially to each of the energy storage blocks 106 by a multiplexer 114.

The battery control module 112 may transmit the minimum and maximum voltages to a supervisor module 116. The supervisor module 116 may perform actions based upon the minimum and maximum values. For example only, the supervisor module 116 may instruct the loads/generators 102 to stop charging the energy storage pack 104 if the maximum value exceeds a threshold. The supervisor module 116 may instruct the loads/generators 102 to begin charging the energy storage pack 104 if the minimum value drops below a threshold.

The battery control module 112 monitors each of the voltages of the energy storage blocks 106 before determining the minimum and maximum values. If the voltages of the energy storage blocks 106 change quickly, the minimum and maximum values may not be accurate by the time they are received by the supervisor module 116.

SUMMARY

A battery control system comprises a battery control module, an averaging module, and a supervisor module. The battery control module measures voltages of N energy storage blocks, wherein N is an integer greater than one, and determines a first voltage of the voltages at a first rate. The first voltage is one of a maximum voltage and a minimum voltage. The averaging module calculates an average voltage at a second rate that is greater than the first rate. The average voltage is based on a measured total voltage of an energy storage pack including the N energy storage blocks. The supervisor module generates an updated voltage based on the first voltage and the average voltage and controls a vehicle system based on the updated voltage.

A method comprises measuring voltages of N energy storage blocks, wherein N is an integer greater than one; determining a first voltage of the voltages at a first rate, where the first voltage is one of a maximum voltage and a minimum voltage; calculating an average voltage at a second rate that is greater than the first rate, where the average voltage is based on a measured total voltage of an energy storage pack including the N energy storage blocks; generating an updated voltage based on the first voltage and the average voltage; and controlling a vehicle system based on the updated voltage.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

Figure 1:
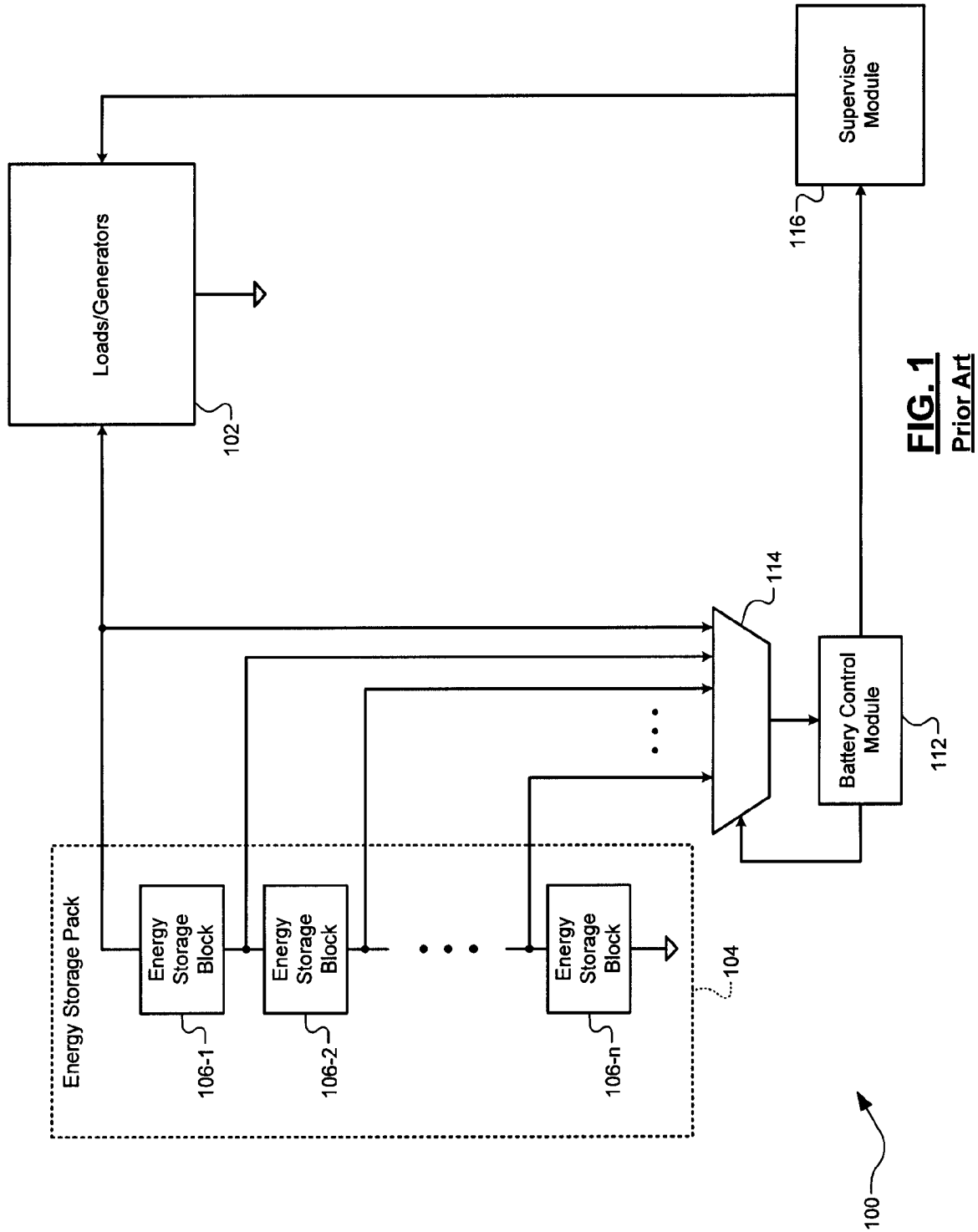
FIG. 1 is a functional block diagram of an energy storage system according to the prior art.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

As used herein, the term module refers to, is part of, or includes an Application Specific Integrated Circuit (ASIC), an electronic circuit, a processor (shared, dedicated, or group) and memory that execute one or more software or firmware programs, a combinational logic circuit, and/or other suitable components that provide the described functionality.

Figure 2:
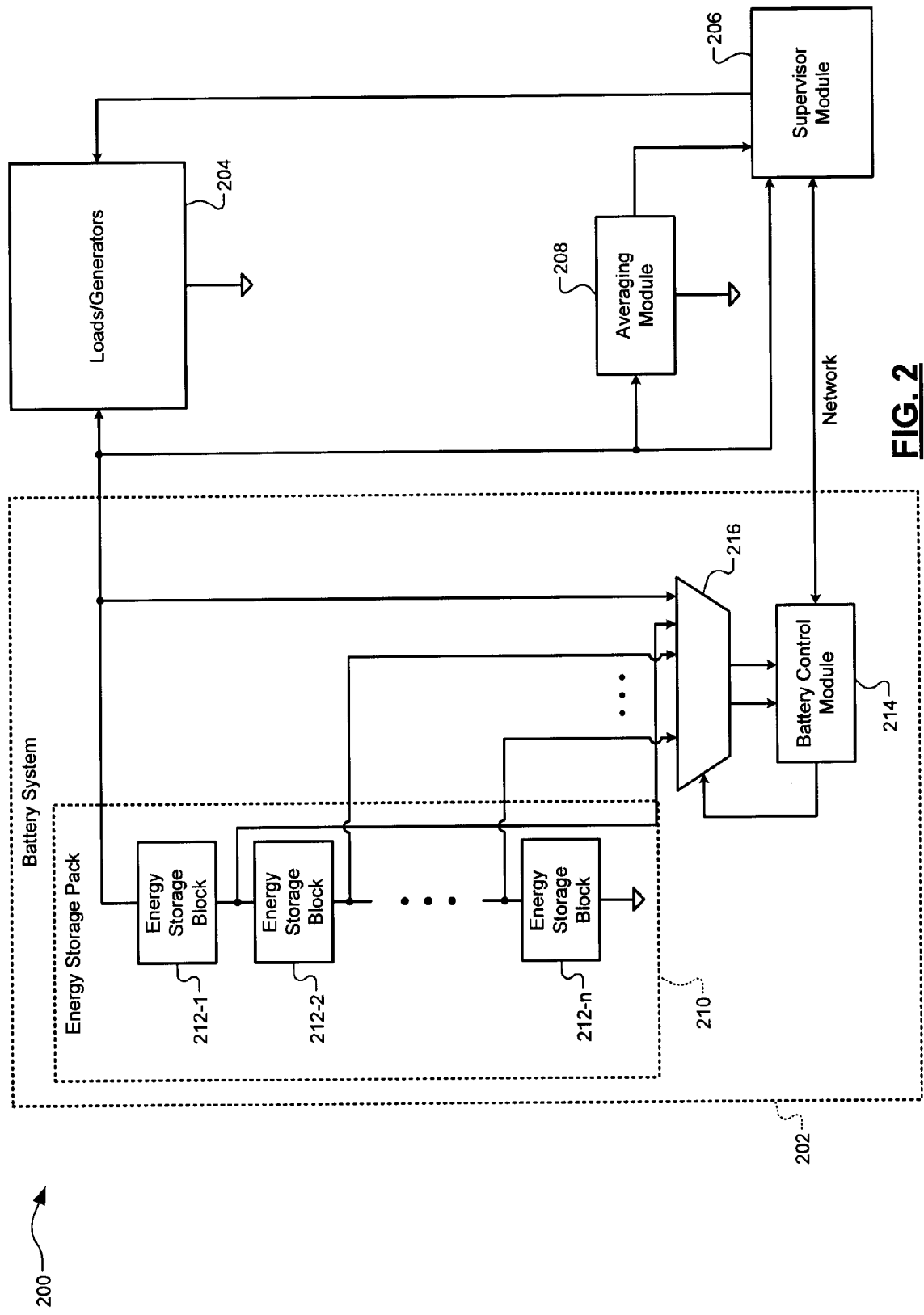
FIG. 2 is a functional block diagram of an exemplary energy storage system according to the principles of the present disclosure.

Referring now to FIG. 2, a functional block diagram of an exemplary energy storage system 200 is presented. The energy storage system 200 includes a battery system 202, loads/generators 204, a supervisor module 206, and an averaging module 208. The battery system 202 includes an energy storage pack 210 that includes energy storage blocks 212. In various implementations, there may be 20 energy storage blocks 212 (n=20).

A battery control module 214 may use a multiplexer 216 to sequentially measure the voltages of the energy storage blocks 212 and identify the maximum and minimum voltages. The multiplexer 216 may sequentially connect taps on either side of each of the energy storage blocks 212 to the battery control module 214. Alternatively, the multiplexer 216 may connect a single tap corresponding to each of the energy storage blocks 212 to the battery control module 214. The battery control module 214 may subtract the voltages measured for adjacent taps to determine the voltage of one of the energy storage blocks 212. The battery control module 214 may include a digital-to-analog converter to convert each voltage to digital form.

To determine minimum and maximum voltages for n energy storage blocks, n measurements may be made. After the n measurements are made, the battery control module 214 may transmit the maximum and/or minimum voltage values to the supervisor module 206. For example only, these values may be transmitted over a network, such as a controller area network (CAN).

The loads/generators 204 are connected across the entire energy storage pack 210. In various implementations, the energy storage pack 210 and the loads/generators 204 may both be referenced to a common potential, such as a ground potential. The total voltage across the energy storage pack 210 is therefore available to the averaging module 208 as a single measurement.

The averaging module 208 can determine an average voltage of the energy storage blocks 212 by dividing the total voltage of the energy storage pack 210 by the number of energy storage blocks 212, n. Determining the average voltage therefore requires only one measurement, the voltage of the entire energy storage pack 210, while determining minimum and maximum voltages requires n measurements. The average voltage can therefore be updated more frequently. Mathematically, the average voltage of the energy storage blocks 212 will be between the current minimum and maximum voltages of the energy storage blocks 212.

The voltages of the energy storage blocks 212 may change more quickly than the minimum and maximum voltages can be measured by the battery control module 214. The average voltage, however, can be determined from the total voltage of the energy storage pack 210 more frequently than the actual minimum and maximum voltages can be determined. The average voltage will therefore reflect the voltage changes in the energy storage blocks 212 more quickly.

For example, the average voltage may be less than the most recently updated minimum voltage or greater than the most recently updated maximum voltage. This implies that the actual minimum or maximum voltage has changed since the minimum/maximum measurement was made. In such cases, an updated minimum voltage can be generated that is less than or equal to the average voltage. Alternatively, an updated maximum voltage can be generated that is greater than or equal to the average voltage.

For example only, the updated minimum voltage may be set equal to the average voltage when the average voltage is less than the previous updated minimum voltage. The average voltage provides a conservative estimate of the actual minimum voltage of the energy storage blocks 212, as the actual minimum voltage may be lower than the average voltage.

In brief, graphical examples of minimum voltages being updated are shown in FIGS. 3-7. FIG. 8 depicts exemplary steps performed in updating minimum and maximum voltages based on the average voltage. A more accurate method can be used if the distance between the average value and the minimum and/or maximum values tends to change relatively slowly. For example, while the minimum and average voltages may decrease fairly rapidly, the spread between the average voltage and the minimum voltage will likely change less rapidly. Therefore, when the average voltage decreases by a certain amount, it can be assumed that the actual minimum voltage decreases by a similar amount. In this way, the minimum value can be updated based on the average voltage even when the average voltage never falls below the most recent minimum voltage.

Figure 9:
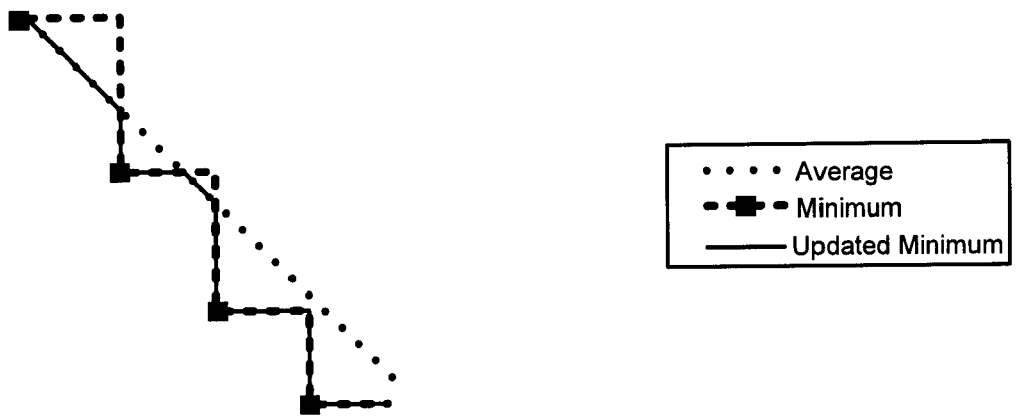
FIG. 9 is a graphical depiction of updating the minimum voltage using the average voltage according to FIGS. 3-8 according to the principles of the present disclosure.
Figure 10:
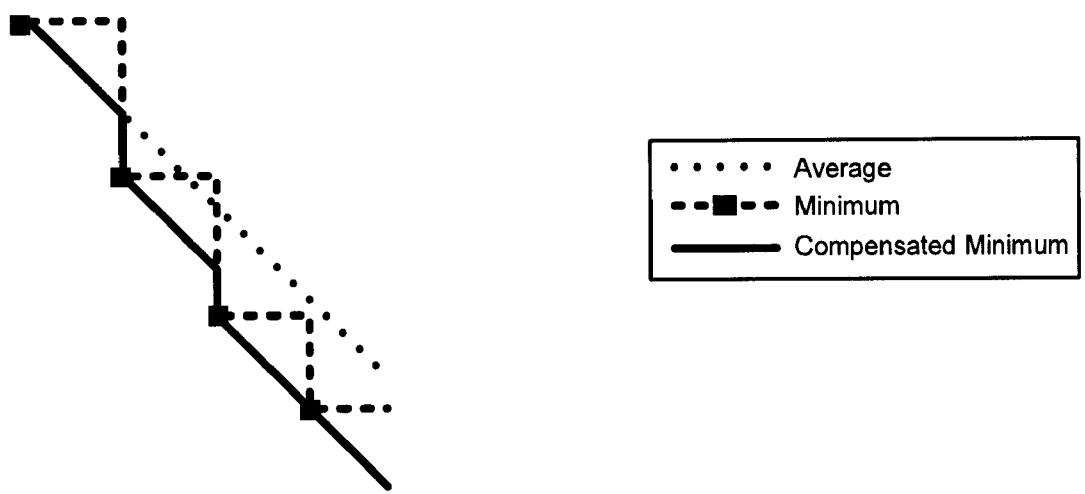
FIG. 10 is a graphical depiction of updating the minimum voltage based upon separation from the average voltage according to the principles of the present disclosure.
Figure 10A:
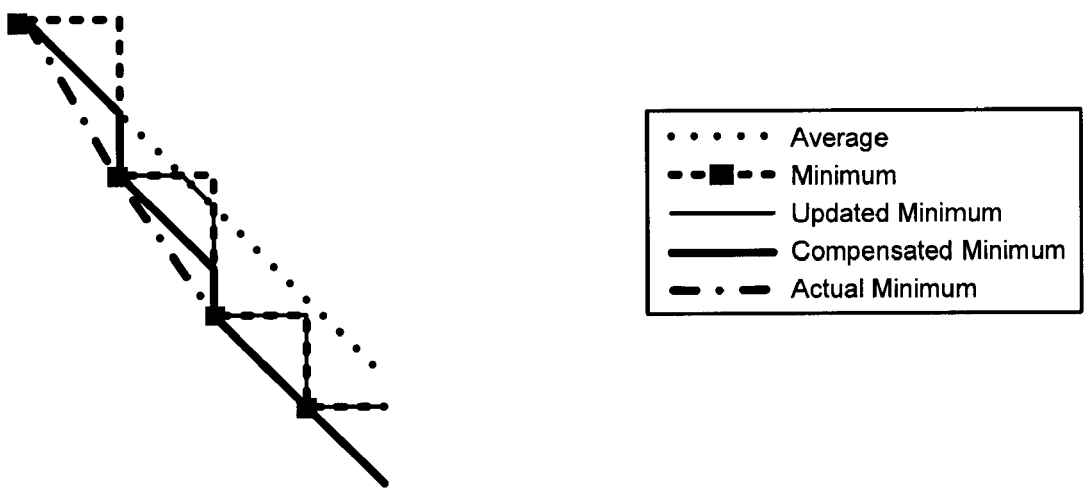
FIG. 10A is a graphical comparison of the updating methods of FIGS. 9 and 10.
Figure 11:
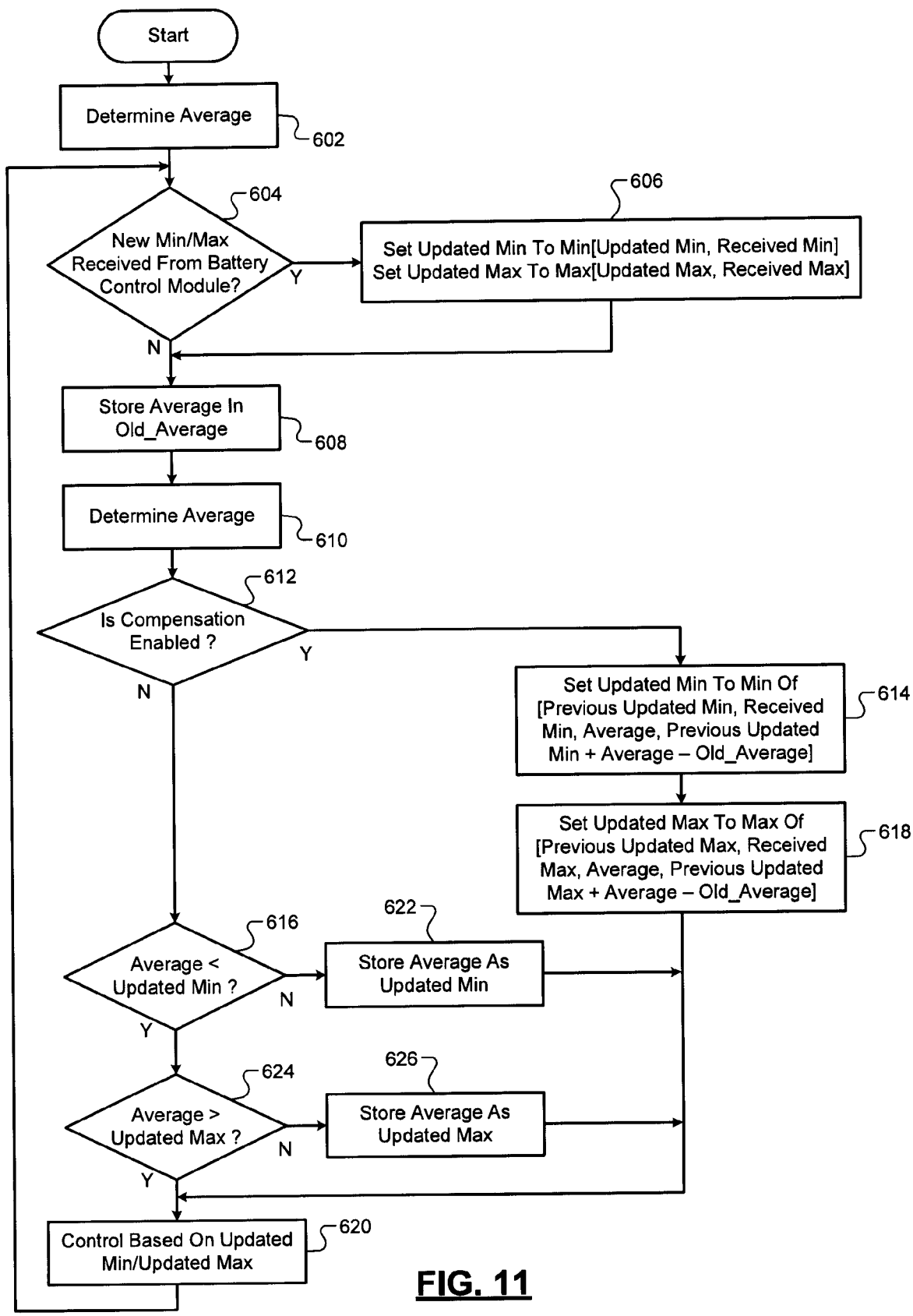
FIG. 11 is a flowchart depicting exemplary steps performed in updating the minimum voltage based on separation according to the principles of the present disclosure.

FIGS. 9-10A graphically depict how changes in the average voltage can be reflected in the minimum voltage according to this method. Exemplary steps performed in this scheme are depicted in FIG. 11. For ease of explanation, the following descriptions illustrate updating the minimum voltage based on the average voltage. The maximum voltage can be updated similarly.

Referring back to FIG. 2, the supervisor module 206 may control operation of the loads/generators 204 based upon parameters such as minimum and maximum voltages of the energy storage blocks 212. For example only, the loads/generators 204 may include an electric motor for propelling the vehicle and an inverter for providing power for vehicle accessories, the electric motor, and/or spark ignition. The loads/generators 204 may also include a generator driven by an internal combustion engine and/or a regenerative braking generator.

The supervisor module 206 may instruct the loads/generators 204 to limit their current draw when the minimum voltage decreases below a first threshold. The supervisor module 206 may also prevent the loads/generators 204 from providing energy to the battery system 202 when the maximum voltage rises above a second threshold.

For example only, the battery control module 214 may determine new minimum and maximum voltages every 100 milliseconds and the averaging module 208 may measure the total voltage of the energy storage pack 210 every 6.25 milliseconds. In this example, the average voltage may be obtained 16 (100/6.25) times faster than the minimum and maximum voltages. The supervisor module 206 can therefore generate updated minimum and maximum voltages between measurements from the battery control module 214. This allows the supervisor module 206 to make decisions based on the more timely updated minimum and maximum voltages.

Figure 3:
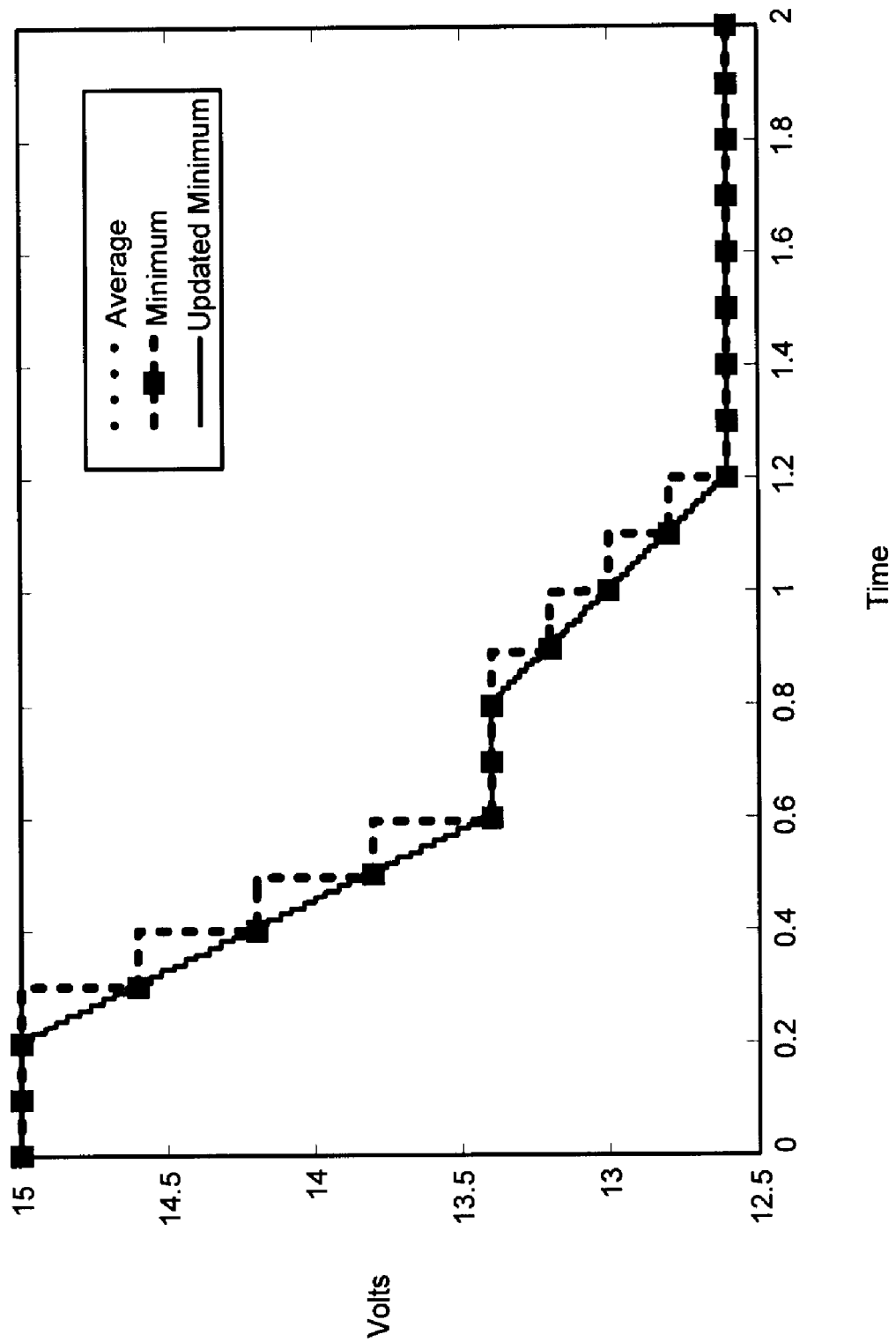
FIG. 3 is a graphical depiction of updating minimum voltage using average voltage according to the principles of the present disclosure.

Referring now to FIG. 3, a graphical depiction of generating an updated minimum voltage using the average voltage is presented. The dashed line represents the minimum value as determined by the battery control module 214. Each square box represents a new minimum voltage determined by the battery control module 214. As seen in FIG. 3, the relatively infrequent determination of minimum voltage creates a stair-step effect when the actual minimum voltage is changing rapidly.

An updated minimum voltage may be generated based on the average voltage if the average voltage is less than the most recent measured minimum voltage. In FIG. 3, the dotted average line is not even seen because the solid updated minimum line is tracking the average voltage. The average voltage is determined more frequently than the minimum voltage, and therefore appears smooth in comparison to the minimum voltage.

The energy storage blocks 212 that generate the traces depicted in FIG. 3 appear well balanced. This means that the energy storage block 212 having the minimum voltage is close to the average voltage of the energy storage blocks 212. At times when voltages are changing quickly, such as between 0.2 and 0.6 seconds, generating an updated minimum voltage to match the average voltage is more accurate than simply relying on the measured minimum voltage.

Figure 4:
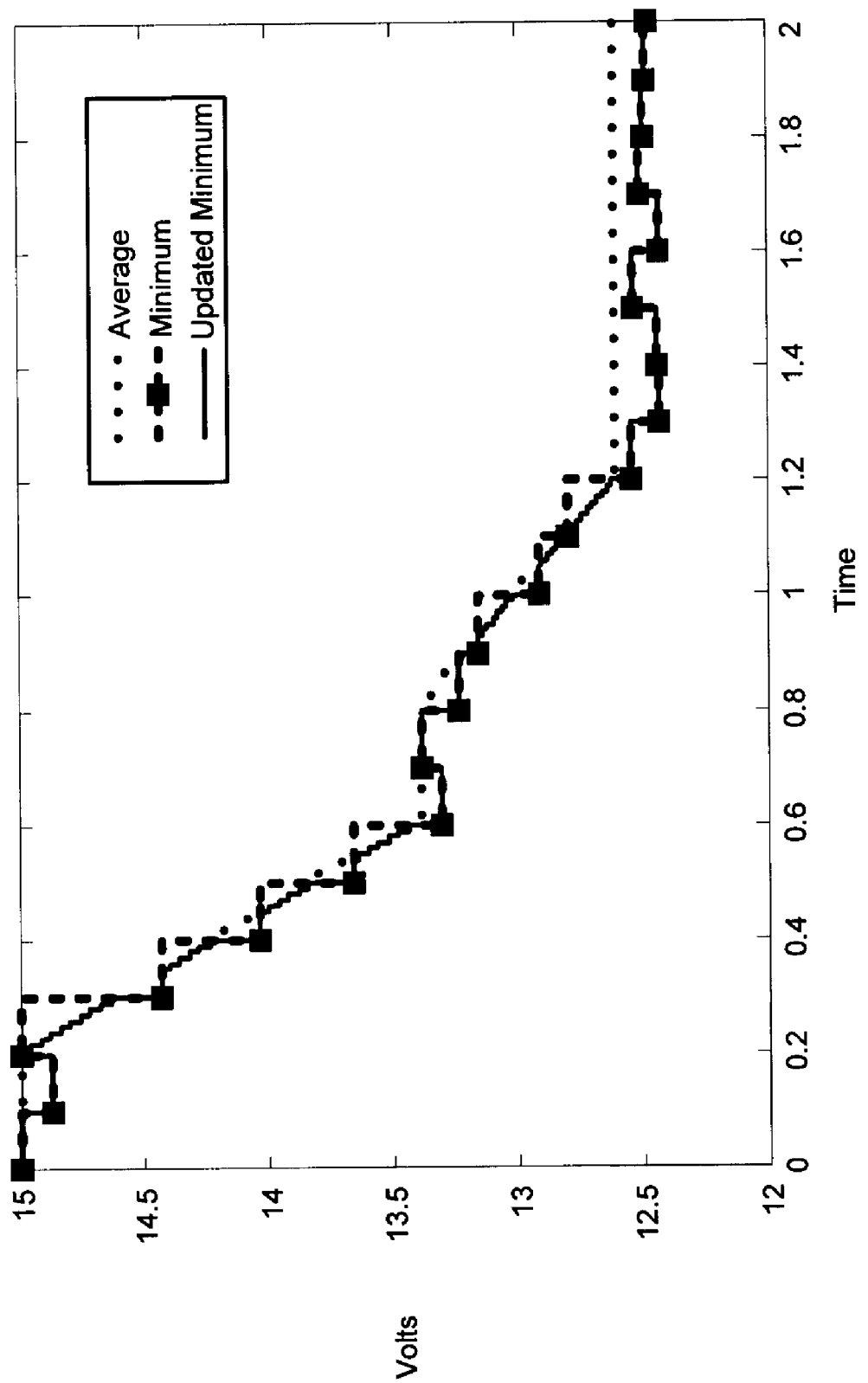
FIG. 4 is a graphical depiction of updating minimum voltage for energy storage blocks exhibiting voltage variation according to the principles of the present disclosure.

Referring now to FIG. 4, a graphical depiction of updating minimum voltage for energy storage blocks 212 exhibiting greater voltage variation is presented. Because the energy storage blocks 212 depicted in FIG. 4 have varying voltages, the minimum voltage is further away from the average voltage. After 1.2 seconds and between 0.6 and 0.9 seconds, the measured minimum voltage is far enough below the average voltage that the average voltage is not used to update the minimum voltage.

However, during times of rapid voltage change, such as between 0.2 seconds and 0.6 seconds, the average voltage can be used to update the minimum voltage for significant periods of time in between minimum voltage measurements. In graphical terms, the average voltage cuts off the sharp corner of the stair-step minimum voltage.

Figure 5:
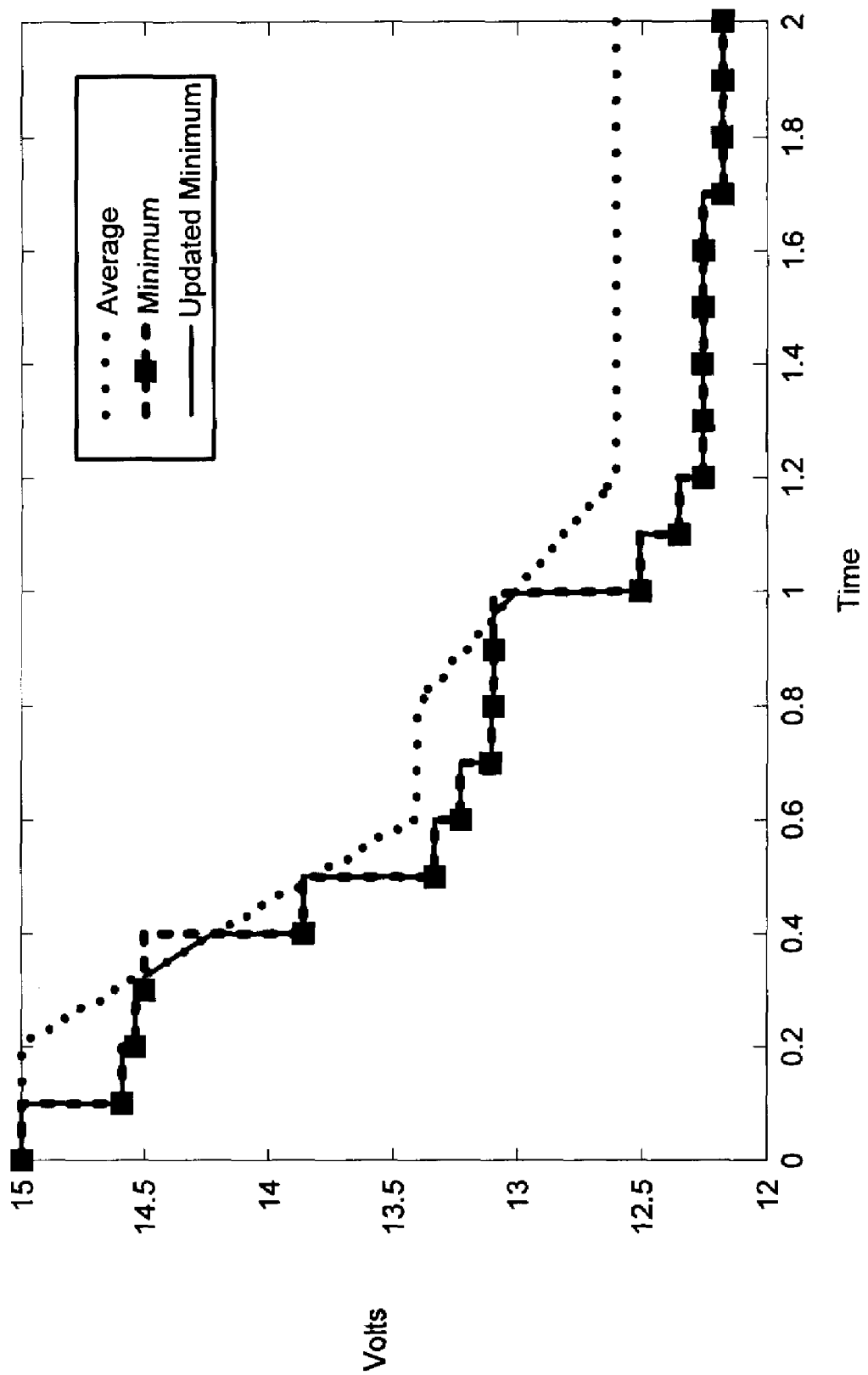
FIG. 5 is a graphical depiction of updating minimum voltage for energy storage blocks having significant voltage variation according to the principles of the present disclosure.

Referring now to FIG. 5, a graphical depiction of updating minimum voltage for energy storage blocks 212 having significant voltage variation is presented. The minimum voltage is below the average voltage for much of the time depicted in FIG. 5. There are instances, however, such as before 0.4 seconds and before 1.0 seconds, when the average voltage dips below the most recently measured minimum voltage.

The average can therefore be used to update the minimum voltage. Updating the minimum voltage using the average voltage therefore provides a benefit at those times. Another strategy may provide even more accurate updating when the energy storage blocks 212 have significant voltage variation, and is described in more detail in FIGS. 9-11.

Figure 6:
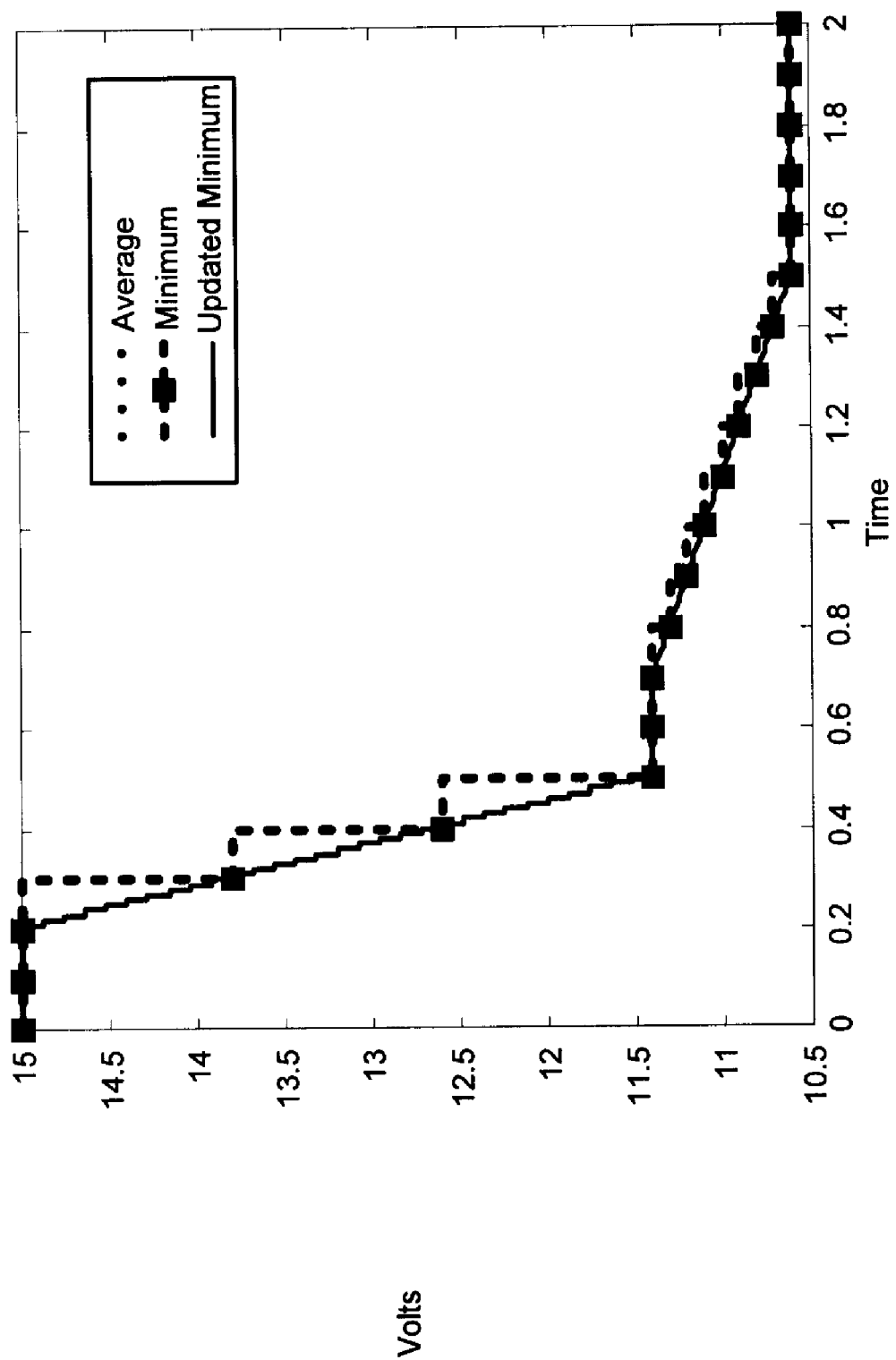
FIG. 6 is a graphical depiction of updating minimum voltage when energy storage block voltages are changing rapidly according to the principles of the present disclosure.

Referring now to FIG. 6, a graphical depiction of updating minimum voltage when energy storage block voltages are changing rapidly is presented. Between 0.2 seconds and 0.5 seconds, voltages of the energy storage blocks decrease quickly. The more frequently measured average voltage can therefore provide a much more accurate updated minimum voltage than using only the three measurements of minimum voltage made at 0.2, 0.3, and 0.4 seconds.

Figure 7:
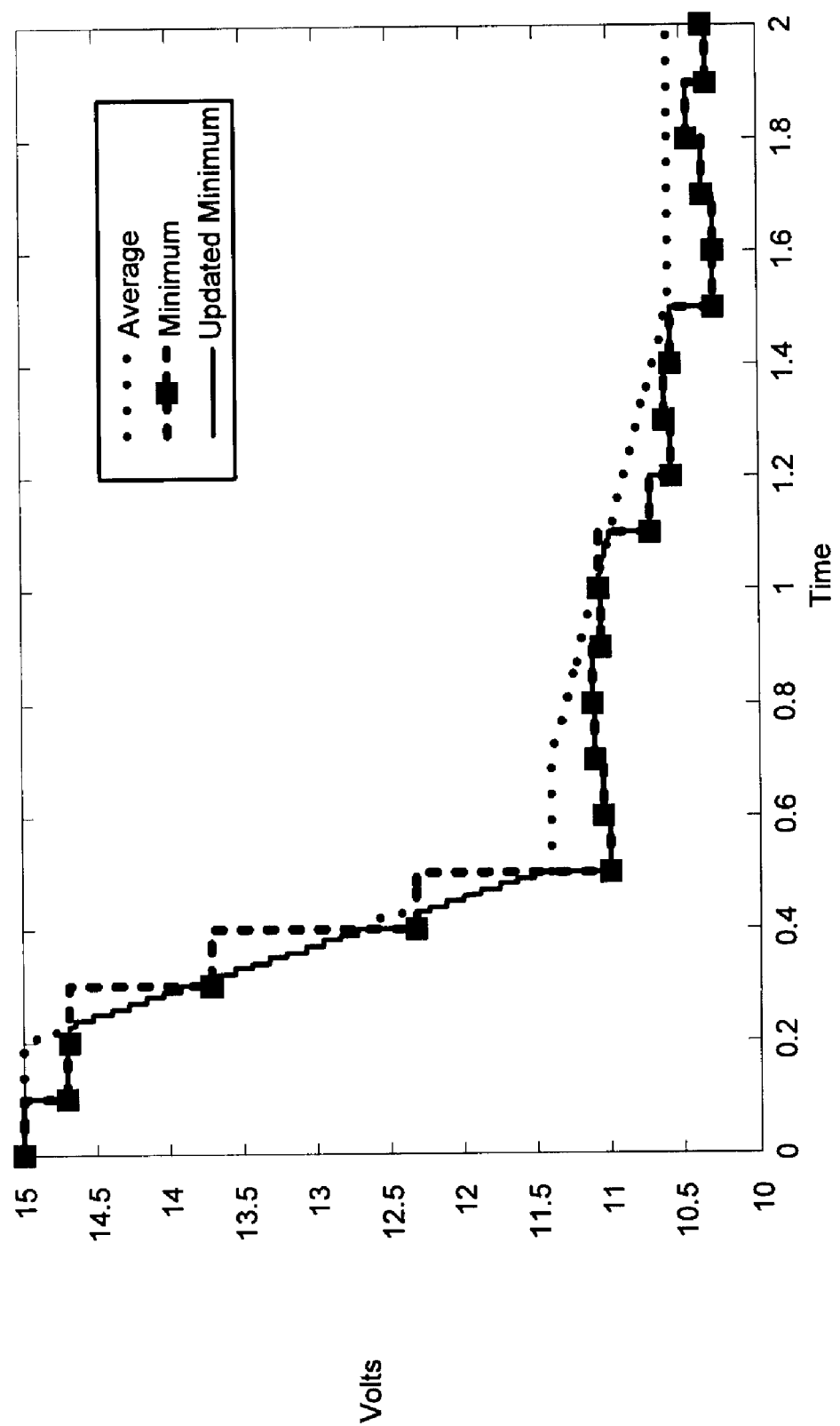
FIG. 7 is a graphical depiction of updating minimum voltage during rapid voltage change for energy storage blocks having significant voltage variation according to the principles of the present disclosure.
Figure 8:
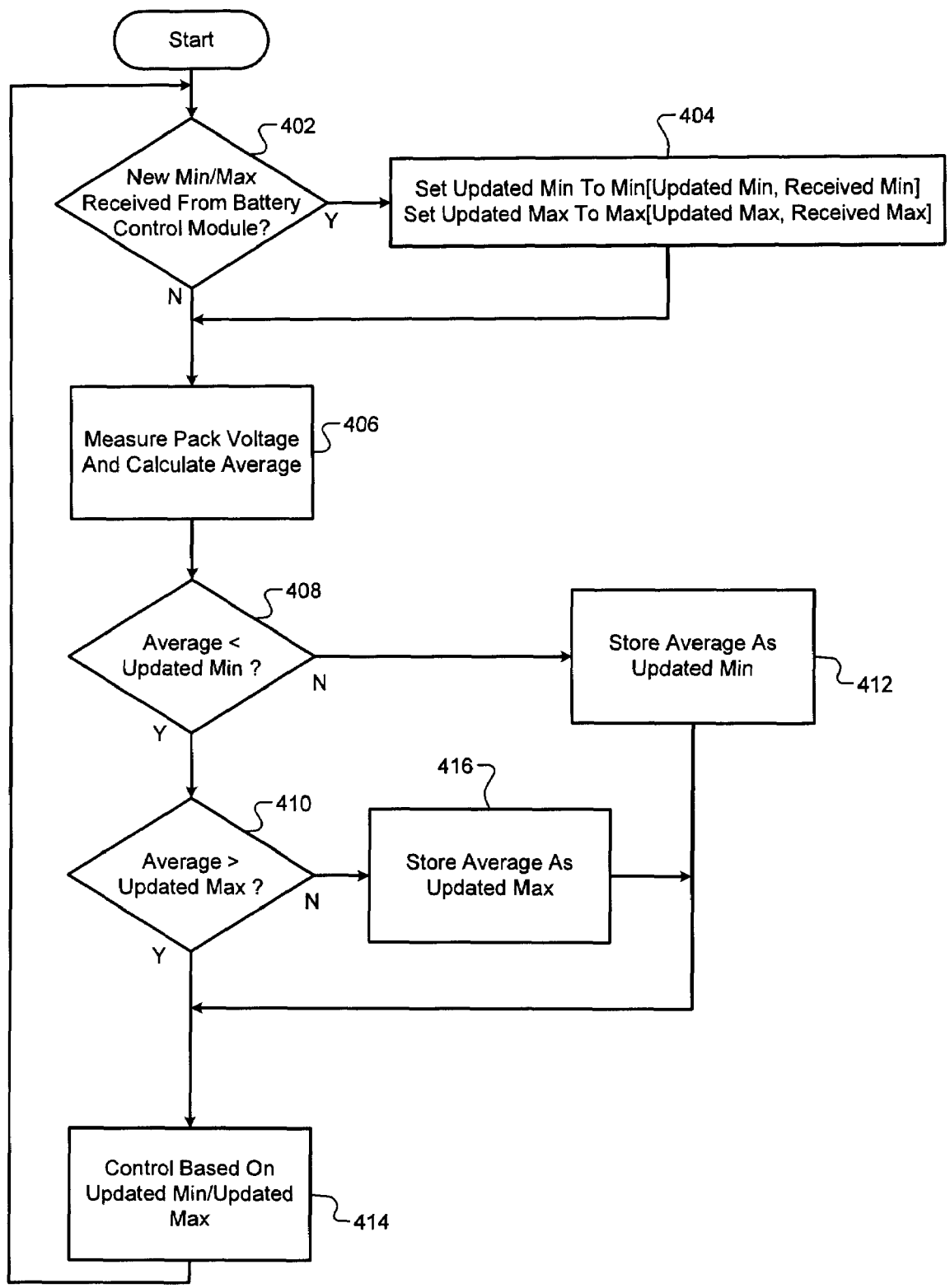
FIG. 8 is a flowchart depicting exemplary steps performed in updating minimum and maximum voltages using the average voltage according to the principles of the present disclosure.

Referring now to FIG. 7, a graphical depiction of updating minimum voltage during rapid voltage change for energy storage blocks 212 having significant voltage variation is presented. While the actual minimum voltage is less than the average voltage, updating the minimum voltage to the average voltage increases the accuracy of the minimum voltage. This is especially true during rapid voltage change, such as between 0.2 seconds and 0.5 seconds.

For example, immediately prior to a new minimum voltage being measured at 0.5 seconds, the updated minimum voltage tracks the average voltage at approximately 11.4 volts. In actuality, the imminent minimum voltage determination, as indicated by the black box at time 0.5 seconds indicates that the actual minimum voltage is 11 volts. However, the 11.4 volt measurement is much closer to the 11 volt actual measurement than is the previous minimum voltage measurement of approximately 12.3 volts.

Referring now to FIG. 8, a flowchart depicts exemplary steps performed in updating minimum and/or maximum voltages using the average voltage. For illustration, the flow chart of FIG. 8 depicts exemplary steps for updating both the minimum voltage and the maximum voltage based upon the average voltage. However, the steps can be easily adapted to update only the minimum voltage or the maximum voltage.

Control begins in step 402, where control determines whether a new minimum or maximum voltage measurement has been received. If new minimum and maximum voltages are available in step 402, control transfers to step 404. Otherwise, control transfers to step 406. The minimum and maximum voltages may be received from the battery control module 214, which has measured each voltage of the energy storage blocks 212 and chosen the minimum and maximum values.

In step 404, control updates the updated min with the value of the received min if the received min is lower than the previous updated min. Control also updates the updated max if the received max is greater than the previous updated max. In other words, control sets the updated min to be the lesser of the updated min and the received min, and sets the updated max to be the greater of the updated max and the received max.

When step 404 is encountered for the first time, control may store the received minimum and maximum voltages as the updated minimum and maximum voltages. Control continues in step 406. In step 406, the average voltage of the energy storage blocks 212 is determined. For example, the total voltage of the energy storage pack 210 may be measured and divided by the number of energy storage blocks.

Control continues in step 408, where control determines whether the average voltage is less than the updated minimum voltage. If so, control continues in step 410; otherwise, control transfers to step 412. In step 412, the updated minimum voltage is updated to be equal to the average voltage. Control then continues in step 414.

In step 410, control determines whether the average voltage is greater than the updated maximum voltage. If so, control continues in step 414; otherwise, control transfers to step 416. In step 416, the updated maximum voltage is updated to be equal to the average voltage, and control continues in step 414. In step 414, the updated minimum and maximum voltages can be used by the supervisor module 206. Control returns to step 402.

Referring now to FIG. 9, a graphical depiction of updating the minimum voltage using the average voltage according to FIGS. 3-8 is presented. Because the energy storage blocks depicted in FIG. 9 are not well balanced, the minimum voltage is significantly lower than the average voltage. Ideally, the updated minimum voltage would connect the measured minimum voltage boxes with continuous curves or lines.

This is not possible without knowing what the next minimum measurement will be. However, it may be assumed that the separation between the minimum voltage and the average voltage changes less quickly than the average voltage and the minimum voltage themselves. Accordingly, a decrease in average voltage may be assumed to indicate a corresponding decrease in minimum voltage.

Referring now to FIG. 10, a graphical depiction of updating the minimum voltage based upon separation from the average voltage is presented. At the second measured minimum voltage (second black box), the difference between the average voltage and the minimum voltage can be determined. As the average voltage continues to decrease, the minimum voltage may be similarly decreased to maintain the same separation below the average voltage.

When the third minimum voltage is measured, this assumption can be seen to be imperfect, as the new minimum voltage is even further below the average voltage. This new difference can be used to update the minimum voltage as the average voltage continues to decrease. The fourth measured minimum voltage is approximately equal to the minimum voltage updated by maintaining the previous separation. The updated minimum voltage updated by the method described here is referred to as the compensated minimum voltage to distinguish it from an updated minimum voltage according to a method such as shown in FIG. 9. Compensation may be an optional mode that is selectively applied.

Referring to FIG. 10A, a graphical comparison of the updating methods of FIGS. 9 and 10 is presented. The thin line indicating the updated minimum voltage substantially follows the stair step of the minimum voltage measurements. Meanwhile, the compensated minimum voltage (thick line) closely tracks the actual minimum voltage, which is shown by a dash-dot line.

Referring now to FIG. 11, a flowchart depicts exemplary steps performed in updating the minimum voltage according to the method shown in FIG. 10. As in FIG. 8, the steps of FIG. 11 update both the minimum and the maximum voltages. The steps can be modified to only update the minimum or the maximum voltage.

Control begins in step 602, where the average voltage is determined. As described in FIG. 8, the average voltage may be determined by dividing the total voltage of the energy storage pack 210 by the number of energy storage blocks 212. Control continues in step 604, where control determines whether new minimum and maximum voltages have been received from the battery control module. If so, control transfers to step 606; otherwise, control transfers to step 608.

In step 606, control updates the updated min with the value of the received min if the received min is lower than the previous updated min. Control also updates the updated max if the received max is greater than the previous updated max. In other words, control sets the updated min to be the lesser of the updated min and the received min, and sets the updated max to be the greater of the updated max and the received max. When step 606 is encountered for the first time, control may store the received minimum and maximum voltages as the updated minimum and maximum voltages. Control continues in step 608.

In step 608, the average voltage is stored into a holding variable called old_average. Control continues in step 610, where a new average voltage is determined. Control continues in step 612, where control determines whether compensation is enabled. Compensation refers to updating the minimum or maximum voltage as described in FIG. 10. Compensation assumes that the spread between the minimum/maximum voltages and the average voltage will change more slowly than the voltages themselves. If compensation is enabled, control transfers to step 614; otherwise, control transfers to step 616.

In step 614, the minimum of the previous updated minimum voltage, the average, the received minimum voltage, and the previous updated minimum voltage plus the difference between the average voltage and the old_average variable is selected. The selected value is stored as the updated minimum voltage. Control continues in step 618, where the maximum of the previous updated maximum voltage, the average, the received maximum voltage, and the previous updated maximum voltage plus the difference between the average voltage and the old_average variable is selected. The selected value is stored as the updated minimum voltage and control continues in step 620.

In step 616, control determines whether the average voltage is less than the updated minimum voltage. If so, control transfers to step 622; otherwise, control transfers to step 624. In step 622, the updated minimum voltage is updated to be equal to the average voltage, and control continues in step 620.

In step 624, control determines whether the average voltage is greater than the updated maximum voltage. If so, control transfers to step 626; otherwise, control transfers to step 620. In step 626, the updated maximum voltage is set equal to the average voltage and control continues in step 620. In step 620, control uses the updated minimum and maximum voltages to control the energy storage system 200. Control then returns to step 604.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification and the following claims.

What is claimed is:

1. A battery control system comprising:
a battery control module that measures voltages of N energy storage blocks, wherein N is an integer greater than one, and that determines a first voltage of the voltages at a first rate, wherein the first voltage is one of a maximum voltage and a minimum voltage;
an averaging module that calculates an average voltage at a second rate that is greater than the first rate, wherein the average voltage is based on a measured total voltage of an energy storage pack including the N energy storage blocks; and
a supervisor module that generates an updated voltage based on the first voltage and the average voltage and that controls a vehicle system based on the updated voltage.

2. The battery control system of claim 1 wherein the supervisor module generates the updated voltage at the second rate.

3. The battery control system of claim 1 wherein the first voltage is the minimum voltage and the supervisor module generates the updated voltage based on the average voltage when the average voltage is less than the first voltage.

4. The battery control system of claim 1 wherein the first voltage is the maximum voltage and the supervisor module generates the updated voltage based on the average voltage when the average voltage is greater than the first voltage.

5. The battery control system of claim 4 wherein the battery control module determines a minimum voltage of the voltages at the first rate and wherein the supervisor module generates an updated minimum voltage based on the average voltage when the average voltage is less than the minimum.

6. The battery control system of claim 1 wherein the supervisor module selectively generates the updated voltage based on a difference between the first voltage and a previous value of save average voltage.

7. The battery control system of claim 6 wherein the supervisor module selectively generates the updated voltage based on the average voltage plus the difference.

8. The battery control system of claim 6 wherein the supervisor module selectively generates the updated voltage based on at least one of the average voltage, the average voltage plus the difference, the first voltage, and a previous value of the updated voltage.

9. The battery control system of claim 1 wherein the averaging module calculates the average voltage based on the measured total voltage divided by N.

10. The battery control system of claim 1 wherein the battery control module serially measures the voltages of the energy storage blocks and selects one of the voltages of the energy storage blocks as the first voltage.

11. A method comprising:
measuring voltages of N energy storage blocks, wherein N is an integer greater than one;
determining a first voltage of the voltages at a first rate, wherein the first voltage is one of a maximum voltage and a minimum voltage;
calculating an average voltage at a second rate that is greater than the first rate, wherein the average voltage is based on a measured total voltage of an energy storage pack including the N energy storage blocks;
generating an updated voltage based on the first voltage and the average voltage; and
controlling a vehicle system based on the updated voltage.

12. The method of claim 11 further comprising generating the updated voltage at the second rate.

13. The method of claim 11 further comprising generating the updated voltage at the second rate.

14. The method of claim 11 wherein the first voltage is the maximum voltage and further comprising generating the updated voltage based on the average voltage when the average voltage is greater than the first voltage.

15. The method of claim 14 further comprising:
determining a minimum voltage of the voltages at the first rate; and
generating an updated minimum voltage based on the average voltage when the average voltage is less than the minimum voltage.

16. The method of claim 11 further comprising selectively generating the updated voltage based on a difference between a previous value of the average voltage and the first voltage.

17. The method of claim 16 further comprising selectively generating the updated voltage based on the average voltage plus the difference.

18. The method of claim 16 further comprising selectively generating the updated voltage based on one of the average voltage, the average voltage plus the difference, the first voltage, and a previous value of the updated voltage.

19. The method of claim 11 further comprising calculating the average voltage based on the measured total voltage divided by N.

20. The method of claim 11 further comprising:
serially measuring the voltages of the energy storage blocks; and
selecting one of the voltages of the energy storage blocks as the first voltage.

* * * * *